(12) United States Patent
Wagai

(10) Patent No.: US 9,172,347 B2
(45) Date of Patent: Oct. 27, 2015

(54) WAFER, METHOD OF MANUFACTURING PACKAGE, AND PIEZOELECTRIC OSCILLATOR

(75) Inventor: Toshiyuki Wagai, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 913 days.

(21) Appl. No.: 13/406,992

(22) Filed: Feb. 28, 2012

(65) Prior Publication Data

US 2012/0225254 A1    Sep. 6, 2012

(30) Foreign Application Priority Data

Mar. 3, 2011    (JP) ................. 2011-046393

(51) Int. Cl.
*H01L 21/78*    (2006.01)
*H03H 3/02*    (2006.01)
*H03H 9/10*    (2006.01)

(52) U.S. Cl.
CPC ............... *H03H 3/02* (2013.01); *H03H 9/1014* (2013.01); *H03H 2003/026* (2013.01); *Y10T 428/2457* (2015.01)

(58) Field of Classification Search
CPC ........................... Y10T 428/2457; H03H 3/02
See application file for complete search history.

(56) References Cited

U.S. PATENT DOCUMENTS

| | | | |
|---|---|---|---|
| 6,686,225 B2 | 2/2004 | Wachtler | |
| 6,955,976 B2 | 10/2005 | Hartwell et al. | |
| 7,859,084 B2 | 12/2010 | Utsumi et al. | |
| 2003/0102540 A1 | 6/2003 | Lee | |
| 2004/0219764 A1 | 11/2004 | Syllaios et al. | |
| 2005/0009299 A1 | 1/2005 | Wada et al. | |
| 2005/0009301 A1 | 1/2005 | Nagai et al. | |
| 2007/0155056 A1 | 7/2007 | Kang et al. | |
| 2009/0018035 A1 | 1/2009 | Lee et al. | |
| 2009/0197394 A1 | 8/2009 | Parekh | |
| 2010/0207698 A1 | 8/2010 | Tange | |
| 2010/0215906 A1 | 8/2010 | Tange | |
| 2010/0237740 A1 | 9/2010 | Aratake et al. | |
| 2011/0220383 A1 | 9/2011 | Sugiyama | |
| 2011/0223363 A1 | 9/2011 | Sugiyama | |
| 2012/0228744 A1 | 9/2012 | Kawada | |

FOREIGN PATENT DOCUMENTS

| | | |
|---|---|---|
| JP | 10-206458 A | 8/1998 |
| JP | 2000-077552 A | 3/2000 |
| JP | 2006-282480 A | 10/2006 |
| JP | 2006-339896 A | 12/2006 |

(Continued)

OTHER PUBLICATIONS

International Search Report for International Application No. PCT/JP2008/071646, dated Jan. 13, 2009, 1 page.

(Continued)

*Primary Examiner* — Donald J Loney
(74) *Attorney, Agent, or Firm* — Brinks Gilson & Lione

(57) ABSTRACT

To provide a wafer, a method of manufacturing a package, and a piezoelectric oscillator in which warping of a wafer body is reduced to improve the yields. A wafer for lid substrate has a product region in which a number of recess portions for cavities are formed and a non-forming region of the recess portions set in the product region in the form of a straight line extending along a diameter direction of the product region.

5 Claims, 7 Drawing Sheets

(56) References Cited

FOREIGN PATENT DOCUMENTS

| JP | 2008-058005 A | | 3/2008 |
|----|---------------|---|--------|
| JP | 2010-124015 A | | 6/2010 |
| WO | WO 2010/061470 A1 | | 6/2010 |
| WO | WO 2010/070753 | * | 6/2010 |

OTHER PUBLICATIONS

International Search Report for International Application No. PCT/JP2008/073043, dated Jan. 20, 2009, 1 page.
Office Action from co-pending U.S. Appl. No. 13/113,433, dated Sep. 5, 2012, 6 pages.
Office Action from co-pending U.S. Appl. No. 13/114,415, dated Oct. 19, 2012, 10 pages.
Liu et al., "A New Approach to Fabricate Deep Cavities in Pyrex7740 Glass for Vacuum Packaging of Sensor," IEEE Sensors Conference, 2008, pp. 466-469.
Turner et al., "Modeling of direct wafer bonding: Effect of wafer bow and etch patterns," Journal of Applied Physics, vol. 92, No. 12, Dec. 15, 2002, pp. 7658-7666.
Office Action from co-pending U.S. Appl. No. 12/708,881, dated Aug. 1, 2012, 10 pages.
Office Action from co-pending U.S. Appl. No. 12/708,881, dated Jan. 2, 2013, 10 pages.
U.S. Appl. No. 12/708,881, filed Feb. 19, 2010 in the United States Patent and Trademark Office.
Notice of Allowance for U.S. Appl. No. 13/114,415, dated Jan. 28, 2013, 8 pages.
Office Action from co-pending U.S. Appl. No. 13/113,433, dated Mar. 5, 2013, 8 pages.
Office Action from co-pending U.S. Appl. No. 13/411,969, dated Mar. 15, 2013, 10 pages.
U.S. Appl. No. 13/113,433, filed May 23, 2011 in the United States Patent and Trademark Office.
U.S. Appl. No. 13/114,415, filed May 24, 2011 in the United States Patent and Trademark Office.
U.S. Appl. No. 13/411,969, filed Mar. 5, 2012 in the United States Patent and Trademark Office.

* cited by examiner

WAFER, METHOD OF MANUFACTURING PACKAGE, AND PIEZOELECTRIC OSCILLATOR

RELATED APPLICATIONS

This application claims priority under 35 U.S.C. §119 to Japanese Patent Application No. 2011-046393 filed on Mar. 3, 2011, the entire content of which is hereby incorporated by reference.

BACKGROUND OF THE INVENTION

1. Field of the Invention

The present invention relates to a wafer, a method of manufacturing a package, and a piezoelectric oscillator.

2. Description of the Related Art

In recent years, a piezoelectric oscillator (in the form of a package) using crystal or the like as a time source, a timing source for a control signal or the like, or a reference signal source has been used in cellular phones and portable information terminal devices (see, for example, JP-A-2010-124015). Various piezoelectric oscillators of this type are known, and a piezoelectric oscillator of an SMD (Surface-Mounting Device) type is known as one example thereof. The piezoelectric oscillator of this type includes, for example, a base substrate and a lid substrate bonded together and made of a glass material, a cavity formed between the substrates, and a piezoelectric oscillating strip (electronic part) housed in the cavity with hermetical sealing.

For manufacturing the abovementioned piezoelectric oscillator, a plurality of recess portions for cavities are first formed in row and column directions over the entire wafer for lid substrate, and a piezoelectric oscillating strip is mounted on a wafer for base substrate in association with each of the cavities in the wafer for lid substrate. Then, the wafers are anodic-bonded with a bonding layer (metal film) interposed between them to provide a wafer bonded unit including a plurality of packages formed in the row and column directions on the wafer. The wafer bonded unit is cut for each of the packages (each of the cavities) formed in the wafer bonded unit to manufacture a plurality of piezoelectric oscillators having the piezoelectric oscillating strips enclosed in the cavities with hermetical sealing.

SUMMARY OF THE INVENTION

The abovementioned wafer for lid substrate has the problem of suffering from warping due to a difference in surface area between a first face (bonding face to the wafer for base substrate) and a second face opposite to the first face after the formation of the recess portions. Specifically, since the plurality of recess portions are formed over the entire first face of the wafer for lid substrate, the first face has a larger surface area than that of the second face. This causes the problem in which the wafer for lid substrate is warped such that the first face bulges.

The warping of the wafer for lid substrate results in the problem in which there is a high probability of defective items produced in a subsequent process to reduce the yields. Specifically, the warped wafer for lid substrate is polished after the formation of the recess portions to cause variations in the polish rate in plane to increase the warping amount. In addition, the warped substrate for lid substrate is anodic-bonded to the wafer for base substrate, so that the wafer bonded unit may be warped in association with the warping of the wafer for lid substrate. In this case, the actual cutting of the wafer bonded unit disadvantageously deviates from the scheduled cutting line. As a result, the wafer bonded unit may not be cut into predetermined sizes.

Another problem is that the bonding of the wafer for base substrate to the warped wafer for lid substrate causes residual stress within the wafer bonded unit to reduce the mechanical strength in the cut piezoelectric oscillators.

The invention has been made in view of the abovementioned circumstances, and it is an object thereof to provide a wafer, a method of manufacturing a package, and a piezoelectric oscillator in which warping of a wafer body is reduced to improve the yields.

The invention provides a wafer for forming a number of packages in which wafers are placed one on another and bonded together to have a cavity between the wafers for housing an electronic part, wherein a wafer body has a product region in which a number of recess portions for the cavities are formed and a non-forming region of the recess portions set in the product region in the form of a straight line extending along a diameter direction of the product region.

With this structure, since the non-forming regions where the recess portions are not formed is formed in the product region of the wafer body, the difference in surface area between both faces can be reduced as compared with the case in which the recess portions are formed over the entire wafer body. Since the non-forming region has a smaller surface area than that of the recess portion forming region in the product region, tensile stress is applied from the recess portion forming region toward the non-forming region (in the direction in which warping of the wafer body is reduced). This can reduce the warping amount of the wafer body caused after the formation of the recess portions. As a result, the probability of the occurrence of defective items can be reduced in a subsequent process. For example, since variations in polish rate can be suppressed in polishing the wafer in a subsequent process, the wafer can be finished with uniform thickness by suppressing unbalanced polishing or the like. In addition, since the occurrence of warping of a wafer bonded unit obtained from bonding of a plurality of wafers can be suppressed, the wafer bonded unit can be cut along a desired scheduled cutting line (cutting line). This can improve the yields to manufacture the package having a desired size.

Since the warping of the wafer body can be reduced, the occurrence of residual stress in a package obtained from bonding of a plurality of wafers can be suppressed. This can enhance the mechanical strength of the package.

In the invention, the plurality of non-forming regions are set along one side of the recess portion.

With this structure, the non-forming region can be ensured while suppressing an increase in space between the adjacent recess portions. The recess portion forming region can be efficiently set on the wafer body to maintain the yields of the group of package products which can be formed from one wafer. As a result, even when the non-forming region is set, the number of the packages taken from one wafer can be ensured.

In the invention, the two non-forming regions are set to intersect at the center of the wafer body.

With this structure, the setting of the non-forming region in the cross shape can suppress the warping uniformly over the entire wafer, the occurrence of warping of the wafer or the like can be suppressed.

According to another aspect, the invention provides a method of manufacturing a package for forming a number of packages in which two wafers are placed one on another and bonded together to have a cavity between the wafers for housing an electronic part, comprising a recess portion forming step of forming a number of recess portions for the cavities in a product region of a first wafer of the two wafers, wherein in the recess portion forming step, a non-forming region of the recess portions is set in the product region of the first wafer in the form of a straight line extending along a diameter direction of the product region, and the number of recess portions are formed at positions avoiding the non-forming region.

With this structure, since the non-forming region of the recess portions is set in the form of a straight line extending along the diameter direction of the product region, and the number of recess portions are formed at the positions avoiding the non-forming region in the recess portion forming step, the difference in surface area between both faces can be reduced as compared with the case in which the recess portions are formed over the entire wafer body. Since the non-forming region has a smaller surface area than that of the recess portion forming region in the product region, tensile stress is applied from the recess portion forming region toward the non-forming region (in the direction in which warping of the wafer body is reduced). This can reduce the warping amount of the wafer body caused after the formation of the recess portions. As a result, the probability of the occurrence of defective items can be reduced in a subsequent process. For example, since variations in polish rate can be suppressed in polishing the wafer in a subsequent process, the wafer can be finished with uniform thickness by suppressing unbalanced polishing or the like. In addition, since the occurrence of warping of a wafer bonded unit obtained from bonding of a plurality of wafers can be suppressed, the wafer bonded unit can be cut along a desired scheduled cutting line (cutting line). This can improve the yields to manufacture the package having a desired size.

Since the warping of the wafer body can be reduced, the occurrence of residual stress in a package obtained from bonding of a plurality of wafers can be suppressed. This can enhance the mechanical strength of the package.

In the invention, an etching step is included in which wet etching is performed on the first wafer after the recess portion forming step.

With this structure, since processing distortion of the wafer can be removed, warping of the wafer can be reduced more effectively.

According to another aspect, the invention provides a piezoelectric oscillator which includes a piezoelectric oscillating strip within the cavity of the package according to the invention with hermetical sealing.

With this structure, since the piezoelectric oscillating strip is manufactured by using the method of manufacturing a package according to the invention, it is possible to improve the yields and suppress the occurrence of residual stress within the package, thereby providing the piezoelectric oscillator which has ensured mechanical strength, high quality, and high reliability.

With the wafer and the method of manufacturing a package according to the invention, warping of the wafer can be reduced to improve the yields.

With the piezoelectric oscillator according to the invention, it is possible to improve the yields and suppress the occurrence of residual stress within the package, thereby providing the piezoelectric oscillator which has ensured mechanical strength, high quality, and high reliability.

DETAILED DESCRIPTION OF THE PREFERRED EMBODIMENTS

An embodiment of the invention will hereinafter be described with reference to the drawings.
(Piezoelectric Oscillator)

Figure 1:
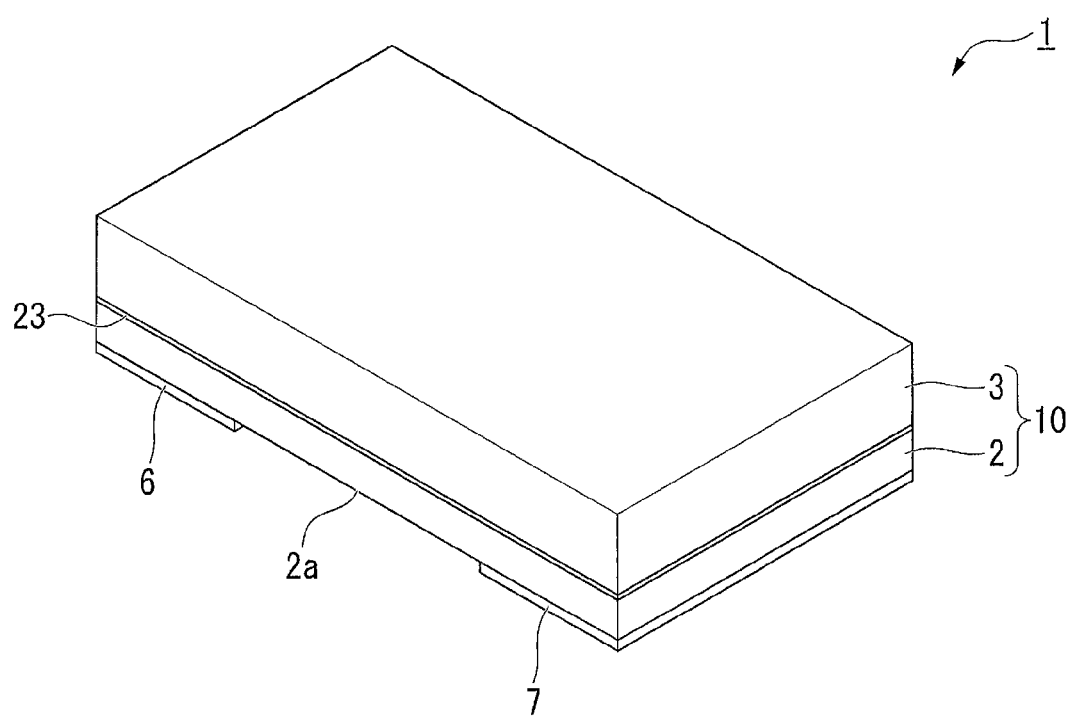
FIG. 1 is an external perspective view of a piezoelectric oscillator in an embodiment of the invention.
Figure 2:
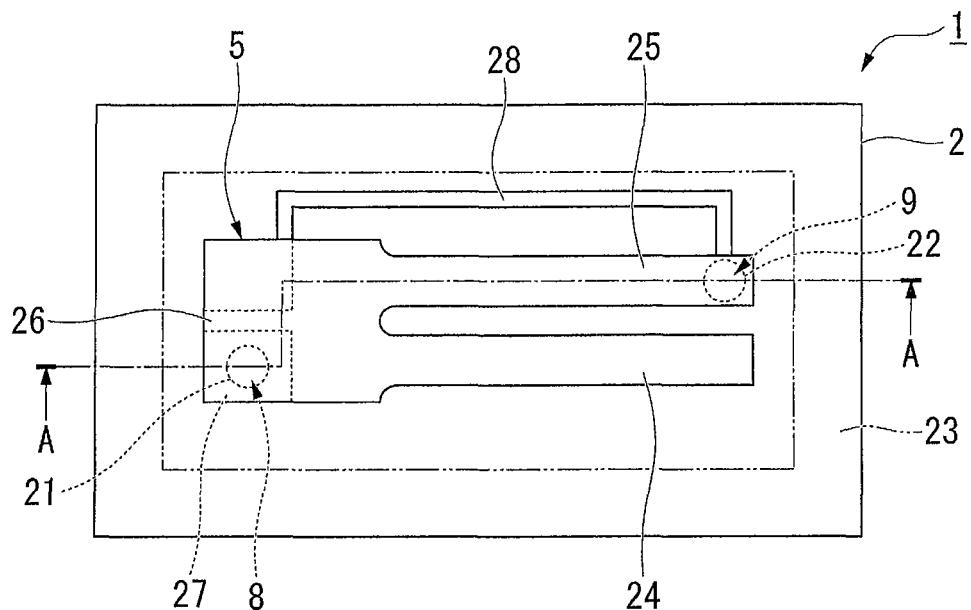
FIG. 2 is a diagram showing the internal structure of the piezoelectric oscillator shown in FIG. 1 and shows a piezoelectric oscillating strip viewed from above with a lid substrate removed.
Figure 3:
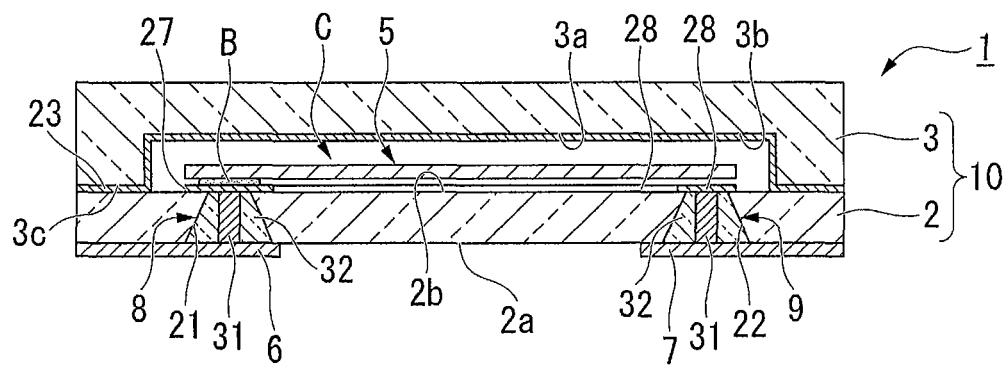
FIG. 3 is a section view of the piezoelectric oscillator taken along line A-A shown in FIG. 2.
Figure 4:
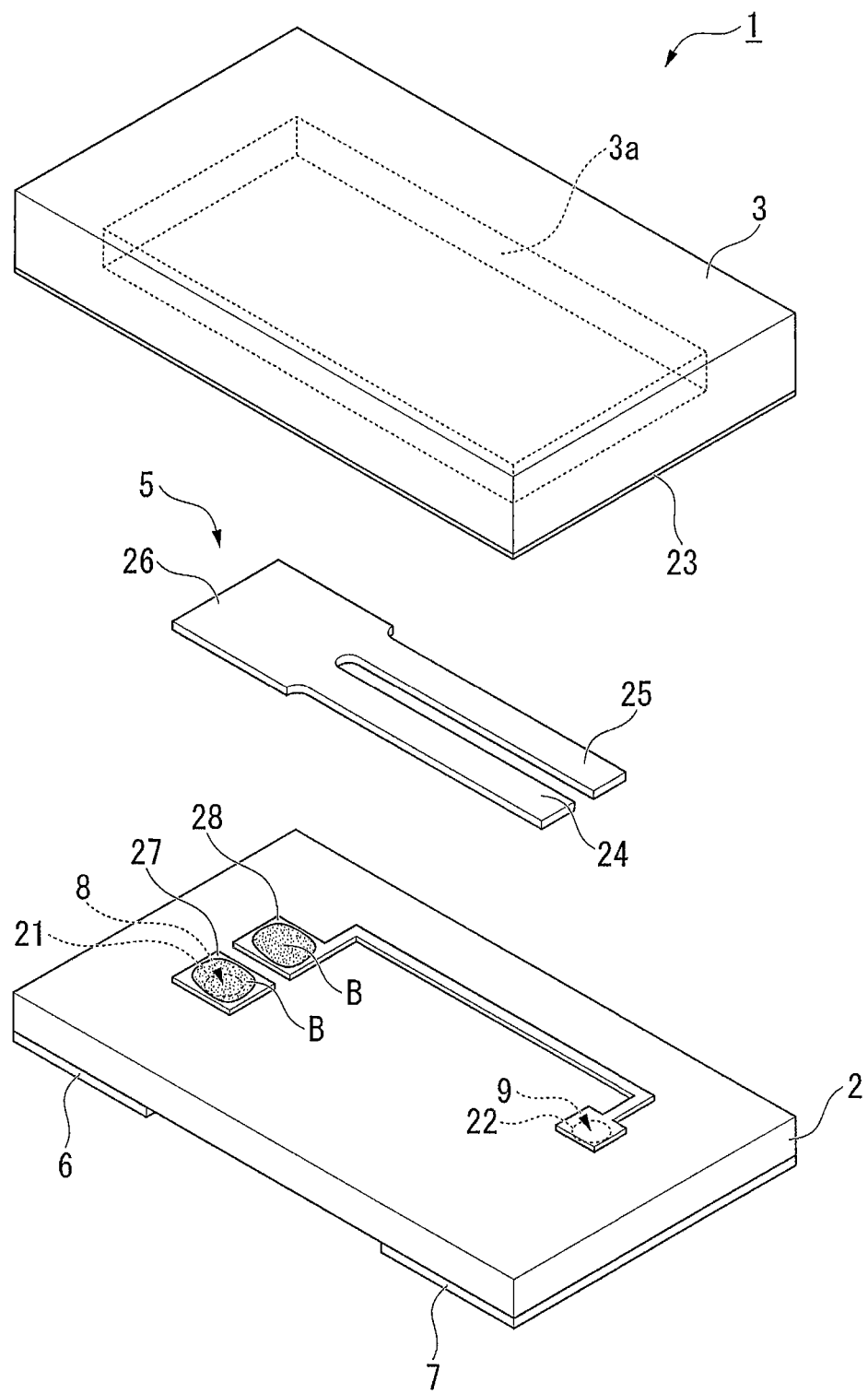
FIG. 4 is an exploded perspective view of the piezoelectric oscillator shown in FIG. 1.

FIG. 1 is an external perspective view of a piezoelectric oscillator in the present embodiment viewed from the side of a lid substrate. FIG. 2 is a diagram showing the internal structure of the piezoelectric oscillator and shows a piezoelectric oscillating strip viewed from above with the lid substrate removed. FIG. 3 is a section view of the piezoelectric oscillator taken along line A-A shown in FIG. 2. FIG. 4 is an exploded perspective view of the piezoelectric oscillator.

As shown in FIG. 1 to FIG. 4, a piezoelectric oscillator 1 of the present embodiment is of a surface-mounting type including a package 10 of a box shape having a base substrate (first substrate) 2 and a lid substrate 3 anodic-bonded with a bonding material 23 interposed between them, and a piezoelectric oscillating strip (electronic part) 5 housed in a cavity C of the package 10. The piezoelectric oscillating strip 5 is electrically connected to external electrodes 6 and 7 placed on a first face 2a (lower face in FIG. 3) of the base substrate 2 through a pair of through electrodes 8 and 9 passing through the base substrate 2.

The base substrate 2 is a transparent insulating substrate made of a glass material, for example soda-lime glass, and formed in a plate shape. The base substrate 2 has a pair of through holes 21 and 22 formed therein in which the pair of through electrodes 8 and 9 are formed. Each of the through holes 21 and 22 has a tapered shape having a diameter gradually reduced from the first face 2a toward second face 2b (upper face in FIG. 3) of the base substrate 2.

The lid substrate 3 is a transparent insulating substrate made of a glass material, for example soda-lime glass similarly to the base substrate 2, and is formed in a plate shape with a size which can be placed on the base substrate 2. A recess portion 3a having a rectangular shape for housing the piezoelectric oscillating strip 5 is formed in an inner face (lower face in FIG. 3) of the lid substrate 3. This recess portion 3a serves as a cavity C for housing the piezoelectric oscillating strip 5 when the base substrate 2 and the lid substrate 3 are placed one on another. The lid substrate 3 is anodic-bonded to the base substrate 2 with the bonding material 23 interposed between them such that the recess portion 3a is opposed to the base substrate 2. Thus, the inner face 3b of the lid substrate 3 provides the recess portion 3a formed in the central portion and a frame region 3c formed around the recess portion 3a and serving as a bonding face to the base substrate 2.

The piezoelectric oscillating strip 5 is a tuning fork-type oscillating strip made of a piezoelectric material such as crystal, lithium tantalate, and a lithium niobate, and oscillates in response to application of a predetermined voltage.

The piezoelectric oscillating strip 5 is of the tuning fork-type having a pair of oscillating arm portions 24 and 25 placed in parallel, a base portion 26 integrally fixing the pair of oscillating arm portions 24 and 25 at their base ends. The piezoelectric oscillating strip 5 has an exciting electrode including a pair of first and second exciting electrodes, not shown, on outer faces of the pair of oscillating arm portions 24 and 25 to oscillate the pair of oscillating arm portions 24 and 25, and a pair of mount electrodes, not shown, electrically connecting the first and second exciting electrodes to routing electrodes 27 and 28, later described.

As shown in FIG. 2 and FIG. 3, the piezoelectric oscillating strip 5 formed in this manner is bump-bonded to the routing electrodes 27 and 28 formed on the second face 2b of the base substrate 2 with bumps B made of gold or the like. More specifically, the first exciting electrode of the piezoelectric oscillating strip 5 is bump-bonded onto one routing electrode 27 through one mount electrode and the bump B, and the second exciting electrode is bump-bonded onto the other routing electrode 28 through the other mount electrode and the bump B. This causes the piezoelectric oscillating strip 5 to be supported such that it is separate from the second face 2b of the base substrate 2 and that the mount electrodes and the routing electrodes 27 and 28 are electrically connected to each other.

The external electrode 6 and 7 are provided on both sides of the first face 2a of the base substrate 2 in a longitudinal direction and are electrically connected to the piezoelectric oscillating strip 5 through the through electrodes 8 and 9 and the routing electrodes 27 and 28. More specifically, the one external electrode 6 is electrically connected to one mount electrode of the piezoelectric oscillating strip 5 through the one through electrode 8 and the one routing electrode 27. The other external electrode 7 is electrically connected to the other mount electrode of the piezoelectric oscillating strip 5 through the other through electrode 9 and the other routing electrode 28.

The through electrodes 8 and 9 are formed of a barrel body 32 integrally fixed to the through holes 21 and 22 with firing and a core material portion 31. The through electrodes 8 and 9 completely fill the through holes 21 and 22 to hold the cavity C hermetically sealed and are responsible for electrically conducting the external electrodes 6 and 7 to the routing electrodes 27 and 28. Specifically, the one through electrode 8 is located below the routing electrode 27 between the external electrode 6 and the base portion 26, and the other through electrode 9 is located below the routing electrode 28 between the external electrode 7 and the oscillating arm portion 25.

The barrel body 32 is provided by firing glass frit in paste form. The barrel body 32 is formed in a cylindrical shape having flat ends and substantially the same thickness as that of the base substrate 2. The core material portion 31 is placed at the center of the barrel body 32 to pass through the barrel body 32. In the present embodiment, the barrel body 32 is formed to have a conical outer shape (tapered shape in section) conforming to the shape of the through holes 21 and 22. The barrel body 32 is fired while it is embedded in the through holes 21 and 22, and is tightly secured to the through holes 21 and 22.

The core material portion 31 is a conductive core material made of a metal material in a cylindrical shape and is formed to have flat ends and substantially the same thickness as that of the base substrate 2 similarly to the barrel body 32. The core material portion 31 ensures the electrical conductivity of the through holes 8 and 9.

The bonding material 23 for anodic bonding is formed over the entire inner face 3b of the lid substrate 3. Specifically, the bonding material 23 is formed over the inner face of the frame region 3c and the recess portion 3a. While the bonding material 23 is formed of a Si film in the present embodiment, the bonding material 23 may be made of Al. The bonding material 23 may be made of a Si bulk material with a resistance reduced by doping or the like. As described later, the bonding material 23 is anodic-bonded to the base substrate 2 to achieve vacuum sealing of the cavity C.

For operating the piezoelectric oscillator 1 formed in this manner, a predetermined driving voltage is applied to the external electrodes 6 and 7 formed on the base substrate 2. This can pass an electric current through the exciting electrodes of the piezoelectric oscillating strip 5 to oscillate the pair of the oscillating arm portions 24 and 25 at a predetermined frequency in directions in which they are brought closer to or away from each other. The oscillation of the pair of the oscillating arm portions 24 and 25 can be used as a time source, a timing source for a control signal, a reference signal source or the like.

(Method of Manufacturing Piezoelectric Oscillator)

Figure 5:
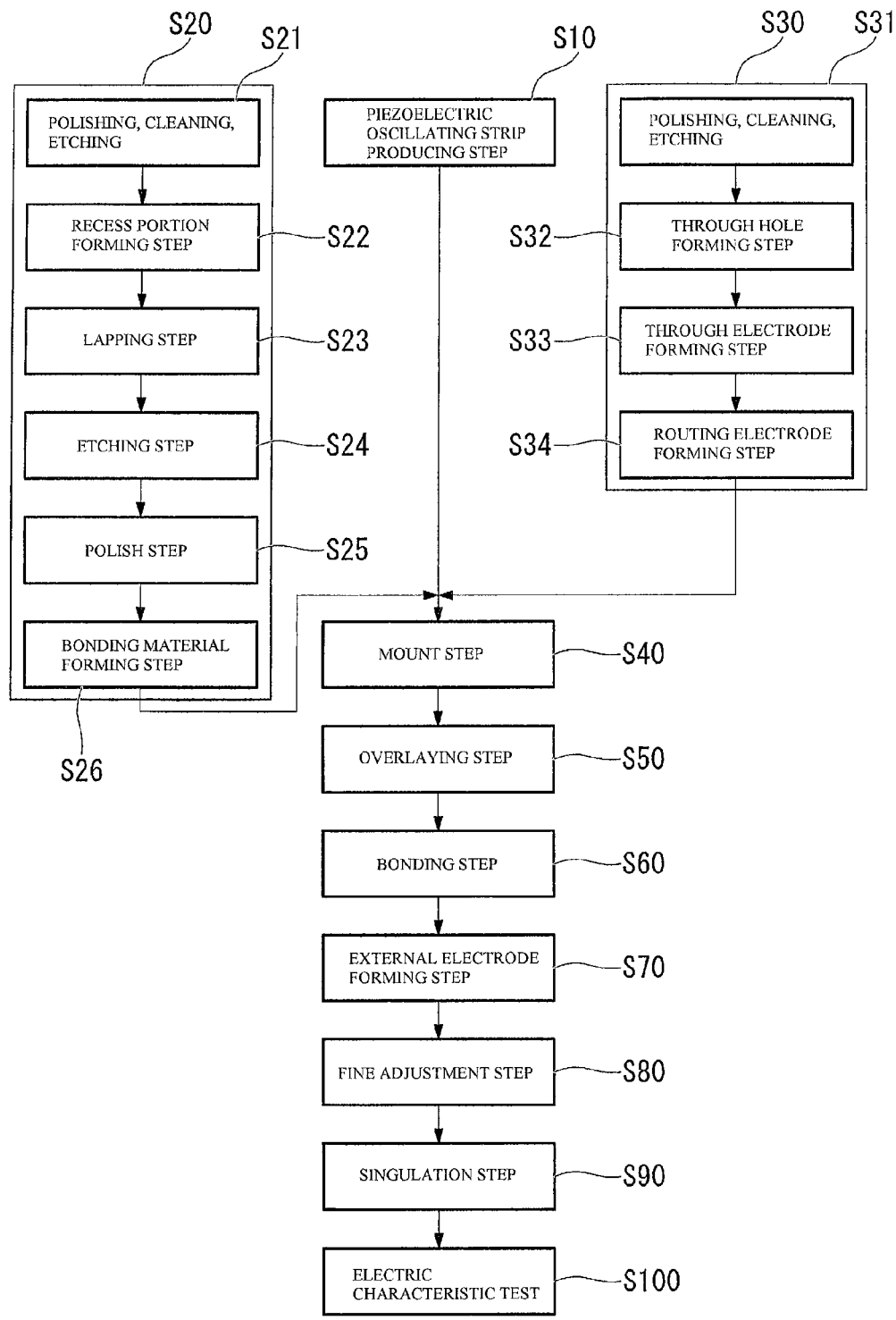
FIG. 5 is a flow chart showing a method of manufacturing the piezoelectric oscillator.
Figure 6:
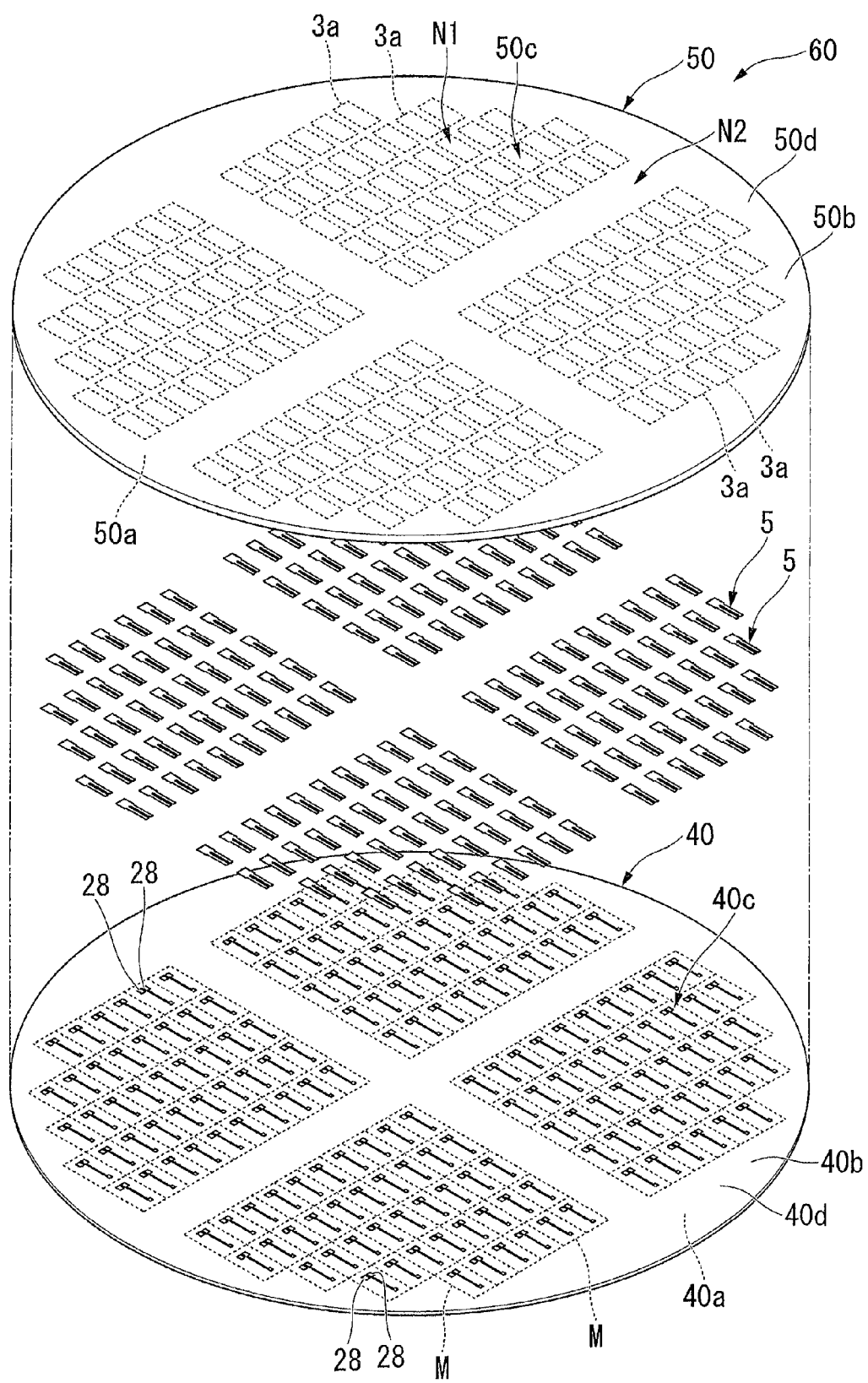
FIG. 6 is a diagram showing a step for explaining the method of manufacturing the piezoelectric oscillator and is an exploded perspective view of a wafer bonded unit.

Next, a method of manufacturing the above piezoelectric oscillator is described. FIG. 5 is a flow chart showing the method of manufacturing the piezoelectric oscillator according to the present embodiment. FIG. 6 is an exploded perspective view of the wafer bonded unit. In the following, description is made of a method of manufacturing a plurality of piezoelectric oscillators 1 simultaneously by enclosing the plurality of piezoelectric oscillating strips 5 between a wafer for base substrate 40 including a series of a plurality of base substrates 2 and a wafer for lid substrate 50 including a series of a plurality of lid substrates 3 to form a wafer bonded unit 60 and then cutting the wafer bonded unit 60. Broken lines M shown in FIG. 6 indicate cutting lines for cutting at a cutting step.

As shown in FIG. 5, the method of manufacturing the piezoelectric oscillator according to the present embodiment mainly has a piezoelectric oscillating strip producing step (S10), a lid substrate wafer producing step (S20), a base substrate wafer producing step (S30), and an assembly step (S40). Of them, the piezoelectric oscillating producing step (S10), the lid substrate wafer producing step (S20), and the base substrate wafer producing step (S30) can be performed in parallel.

First, the piezoelectric oscillator 5 shown in FIG. 1 to FIG. 4 is produced by performing the piezoelectric oscillating strip producing step (S10). After the piezoelectric oscillating strip 5 is produced, rough adjustment is performed for the resonance frequency. Fine adjustment of adjusting the resonance frequency more accurately is performed after mounting.

(Lid Substrate Wafer Producing Step)

Figure 7:
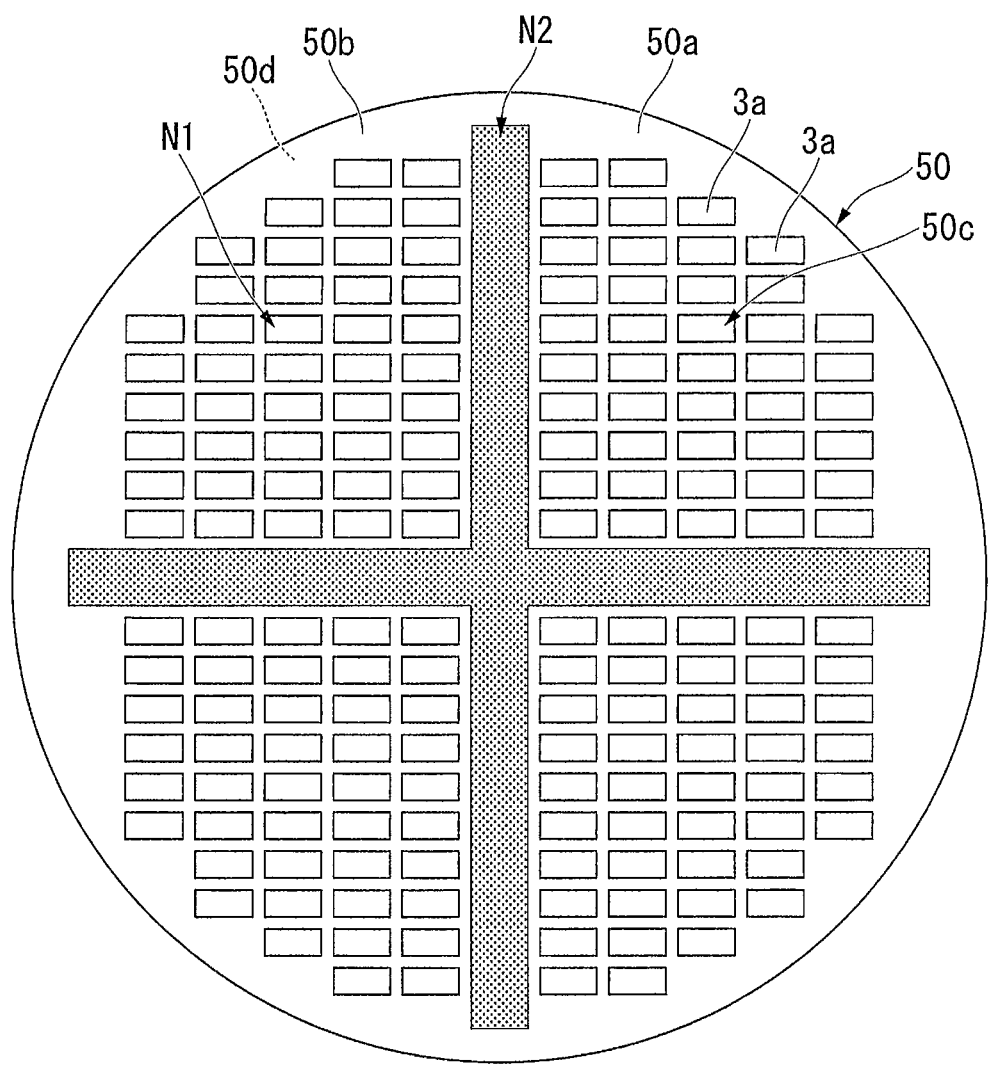
FIG. 7 is a plan view showing a wafer for lid substrate.

FIG. 7 is a plan view of the wafer for lid substrate viewed from the side of the first face.

Next, as shown in FIG. 5 to FIG. 7, the lid substrate wafer producing step (S20) is performed in which the wafer for lid substrate 50, which will provide the lid substrate 3, is produced to the state immediately before the anodic bonding is performed. First, the soda-lime glass is polished to a predetermined thickness, cleaned, and then, subjected to etching or the like to remove a processing altered layer from an outermost face to provide the discoid wafer for lid substrate 50 (S21).

Next, a recess portion forming step (S22) is performed in which a number of recess portions 3a for cavities C are formed with heat pressing, etching or the like, on a first face 50a of the wafer for lid substrate 50 to which a wafer for base substrate 40 is to be bonded. Specifically, a number of recess portions 3a are formed at intervals along row and column directions in a region (hereinafter referred to as a product region 50c) located on an inner side in a diameter direction than an outer peripheral portion 50b on the first face 50a of the wafer for lid substrate 50.

At the recess portion forming step (S21) of the present embodiment, the recess portions 3a are formed such that the product region 50c is divided into a recess portion forming region N1 in which the recess portions 3a are formed and a non-forming region N2 in which the recess portions 3a are not formed. Specifically, the non-forming region N2 is set such that two straight-line regions extending along the diameter direction on the entire wafer for lid substrate 50 intersect in a cross shape including the central portion. The recess portion forming region N1 is set in the region except for the non-forming region N2 on the product region 50c and is divided into four in a fan shape by the two non-forming regions N2. In the recess portion forming region N1, the recess portion 3a is formed in a rectangular shape having a shorter-side direction extending in parallel with one non-forming region N2 and a longer-side direction extending in parallel with the other non-forming region N2.

As described above, the wafer for lid substrate 50 has a difference in surface area between the first face 50a and the face opposite to the first face 50a (hereinafter referred to as a second face 50d) due to the formation of the recess portions 3a in the first face 50a. Specifically, the first face 50a having the recess portions 3a formed therein has a larger surface area than that of the second face 50d. The wafer for lid substrate 50 is warped such that the face having the larger surface area (the first face 50a) bulges due to the difference in surface area between both faces.

In contrast, since the non-forming region N2 in which the recess portions 3a are not produced is formed in the product region 50c of the wafer for lid substrate 50 in the present embodiment, the difference in surface area between both faces can be reduced as compared with the case in which the recess portions 3a are formed over the entire first face 50a. Since the non-forming region N2 has a smaller surface area than that of the recess portion forming region N1 in the product region 50c, tensile stress is applied from the recess portion forming region N1 toward the non-forming region N2 (in the direction in which the warping of the wafer for lid substrate 50 is reduced). This can reduce the warping amount of the wafer for lid substrate 50 caused after the formation of the recess portions 3a.

Then, a lapping step (S23) is performed in which at least the first face 50a of the wafer for lid substrate 50 is lapped (roughly shaved). At the lapping step (S23), a double-side lapping device, not shown, is first used to lap the faces 50a and 50b of the wafer for lid substrate 50. Specifically, the wafer for lid substrate 50 is sandwiched by a lap made of cast iron or the like with a lap agent interposed between them, and the lap and the wafer for lid substrate 50 are relatively moved. This can roughly shave the surfaces 50a and 50b of the wafer for lid substrate 50.

Next, a wet etching is performed on the faces 50a and 50b of the wafer for lid substrate 50 (S24: etching step). At the etching step (S24) of the present embodiment, the wet etching is performed by using an etchant such as ammonium fluoride and pure water added to hydrofluoric acid. In the present embodiment, the etchant is preferably set at a temperature of approximately 30° C. to 45° C., and the etching time is preferably set at approximately 1 to 5 seconds. This removes processing distortion of the wafer for lid substrate 50 produced to the lapping step (S23).

Then, a polish step (S25) is performed in order to mirror-finish at least the first face 50a of the wafer for lid substrate 50. Specifically, a polish pad formed of cerium pad, for example a nonwoven fabric or a sueded polishing cloth is rotated while supplying a polishing agent such as cerium oxide between the polish pad and the wafer for lid substrate 50. This mirror-finishes the faces 50a and 50b of the wafer for lid substrate 50.

Next, a bonding material forming step (S26) is performed in which a bonding material 23 is formed over the entire first face 50a of the wafer for lid substrate 50 (the bonding face to the wafer for base substrate 40 and the inner face of the recess portion 3a). The formation of the bonding material 23 over the entire first face 50a of the wafer for lid substrate 50 can eliminate patterning of the bonding material 23 to reduce the manufacture cost. The formation of the bonding material 23 can be performed through a deposition method such as sputtering and CVD. Since the first face 50a is mirror-finished before the bonding material forming step (S26), the flatness of the surface of the bonding material 23 can be ensured to realize the stable bonding to the wafer for base substrate 40.

With these steps, the lid substrate wafer producing step (S20) is ended.

(Base Substrate Wafer Producing Step)

Next, simultaneously with or after and before the above-mentioned step, the base substrate wafer producing step (S30) is performed in which the wafer for base substrate 40, which will provide the base substrate 2, is produced to the state immediately before the anodic bonding is performed. First, the soda-lime glass is polished to a predetermined thickness, cleaned, and then, subjected to etching or the like to remove a processing altered layer from an outermost face to provide the discoid wafer for base substrate 40 (S31).

Next, a through hole forming step (S32) is performed in which a plurality of through holes 21 and 22 are formed for placing a pair of through electrodes 8 and 9 in the wafer for base substrate 40 by pressing, for example. Specifically, after recess portions are formed in a first face 40a of the wafer for base substrate 40 by pressing, polishing is performed from the side of a second face 40d of the wafer for base substrate 40 to pass the recess portion therethrough to form the through holes 21 and 22.

The pair of through holes 21 and 22 are formed at the positions placed within the recess portion 3a formed in the wafer for lid substrate 50 when both wafers 40 and 50 are later placed one on another, and at the positions in which the one through hole 21 is placed closer to a base portion 26 of the piezoelectric oscillating strip 5 later mounted and the other through hole 22 is placed closer to the tip of oscillating arm portions 24 and 25. The pairs of through holes 21 and 22 are formed in a region (hereinafter referred to as a product region 40c) located on an inner side in a diameter direction than an outer peripheral portion 40b on the second face 40d of the wafer for base substrate 40. In the present embodiment, the pair of through holes 21 and 22 are not formed in the region of the product region 40c that faces the non-forming region N2 formed on the wafer for lid substrate 50. Thus, the pairs of through holes 21 and 22 are formed in the portion of the second face 40d of the wafer for base substrate 40 except for the non-forming region N2 and the outer peripheral portion 40b.

Then, a through electrode forming step (S33) is performed in which the through electrodes 8 and 9 are formed within the through holes 21 and 22 formed at the through hole forming step (S32). This holds the core material portion 31 flush with the surface of the wafer for base substrate 40 within the through holes 21 and 22. With these steps, the through electrodes 8 and 9 can be formed.

A routing electrode forming step (S34) is performed in which a conductive material is patterned on the second face 40d of the wafer for base substrate 40 to form routing electrodes 27 and 28.

In this manner, the base substrate wafer producing step (S30) is finished.

(Assembly Step)

Next, the piezoelectric oscillating strip 5 formed at the piezoelectric oscillating strip producing step (S10) is mounted on the routing electrodes 27 and 28 of the wafer for base substrate 40 formed at the base substrate wafer producing step (S30) with bumps B made of gold or the like interposed between them (S40). Then, an overlaying step (S50) is performed in which the wafer for base substrate 40 and the wafer for lid substrate 50 produced at the producing steps of the wafers 40 and 50 described above are placed one on another. Specifically, the wafers 40 and 50 are aligned at correct positions by using a reference mark, not shown, as an indicator. This causes the mounted piezoelectric oscillating strip 5 to be housed in the cavity C surrounded by the recess portion 3a formed in the wafer for lid substrate 50 and the wafer for base substrate 40.

After the overlaying step (S50), a bonding step (S60) is performed in which the two wafers 40 and 50 placed one on another are put into an anodic-bonding device, not shown, and with the outer peripheral portions of the wafers clamped by a holding mechanism, not shown, a predetermined voltage is applied in a predetermined temperature atmosphere to perform anodic bonding. Specifically, the predetermined voltage is applied between the bonding material 23 and the wafer for lid substrate 50. This causes an electrochemical reaction in the interface between the bonding material 23 and the wafer for lid substrate 50, so that they are brought into intimate contact with each other to achieve the anodic bonding. Thus, the piezoelectric oscillating strip 5 can be enclosed within the cavity C to provide the wafer bonded unit 60 in which the wafer for base substrate 40 and the wafer for lid substrate 50 are bonded together. The anodic bonding of the wafers 40 and 50 as in the present embodiment can prevent deterioration over time, displacement due to shocks, warping of the wafer bonded unit 60 and the like to bond the wafers 40 and 50 more tightly as compared with the case in which the wafers 40 and 50 are bonded with an adhesive or the like.

Then, a pair of external electrodes 6 and 7 electrically connected to the pair of through electrodes 8 and 9 are formed (S70), and the frequency of the piezoelectric oscillator 1 is fine-adjusted (S80).

Then, a singulation step (S80) is performed in which the bonded wafer bonded unit 60 is cut along the cutting line M. Specifically, a UV tape is affixed to the second face 40b of the wafer for base substrate 40 of the wafer bonded unit 60. Next, laser light is applied from the side of the wafer for lid substrate 50 along the cutting line M to form a scribe line along the cutting line M. Then, a cutting blade is put onto the surface of the UV tape along the cutting line M to split the wafer bonded unit 60 (breaking). Thereafter, UV is applied to strip the UV tape. This can separate the wafer bonded unit 60 into the plurality of piezoelectric oscillators 1. Alternatively, the wafer bonded unit 60 may be cut with a different method such as dicing.

An electric characteristic test step (S100) includes measuring and checking the resonance frequency, the resonance resistance value, the drive level characteristics (dependency of the resonance frequency and the resonance resistance value on the exciting power) and the like of the piezoelectric oscillator 1. In addition, the insulation resistance characteristic is also checked. Finally, the outer appearance test of the piezoelectric oscillator 1 is performed to check the dimensions, quality and the like finally.

With these steps, the manufacturing of the piezoelectric oscillator 1 is finished.

In this manner, in the present embodiment, the non-forming region N2 is set to extend along the diameter direction in the product region 50c of the wafer for lid substrate 50.

According to the structure, the difference in surface area between both faces 50a and 50b can be reduced as compared with the case in which the recess portions 3a are formed over the entire first face 50a. Since this can suppress the warping of the wafer for lid substrate 50 due to the difference in surface area, the probability of the occurrence of defective items can be reduced in a subsequent process.

For example, since variations in polish rate can be suppressed in polishing the wafer for lid substrate 50 in a subsequent process, the wafer for lid substrate 50 can be finished with uniform thickness by suppressing unbalanced polishing. In addition, since the occurrence of warping of the wafer bonded unit 60 can be suppressed when the wafers 40 and 50 are bonded in a subsequent process, the wafer bonded unit 60 can be cut along a desired scheduled cutting line (cutting line M). This can improve the yields to manufacture the package 10 having a desired size.

Since the warping of the wafer for lid substrate 50 can be reduced, the occurrence of residual stress in the wafer bonded unit 60 can be suppressed when the wafers 40 and 50 are bonded into the wafer bonded unit 60. This can improve the yields and suppress the occurrence of residual stress within the package 10 to provide the piezoelectric oscillator 1 which has ensured mechanical strength, high quality, and high reliability.

Since the recess portion 3a is formed in the rectangular shape such that the shorter-side direction extends in parallel with the one non-forming region N2 and the longer-side direction extends in parallel with the other non-forming region N2, the non-forming region N2 can be ensured while suppressing an increase in space between the adjacent cavities C (recess portions 3a). The recess portion forming region N1 can be efficiently set on the wafer for lid substrate 50 to maintain the yields of the group of package products which can be formed from one wafer 50. As a result, even when the non-forming region N2 is set, the number of the piezoelectric oscillators 1 taken from one wafer 50 can be ensured.

In addition, the setting of the non-forming region N2 in the cross shape can suppress the warping uniformly over the entire first face 50a of the wafer for lid substrate 50, the occurrence of warping of the wafer for lid substrate 50 can be suppressed.

In the present embodiment, the wet etching is performed on the wafer for lid substrate 50 having the recess portions 3a formed therein at the etching step (S24) after the lapping step (S23), so that the processing distortion of the wafer for lid substrate 50 produced to the lapping step (S23) can be removed. As a result, the warping of the wafer for lid substrate 50 can be further reduced.

(Example 1)

The invention will be described with examples.

The present inventor conducted a test which includes preparing a plurality of sample wafers having the similar structure to that of the wafer for lid substrate 50 of the above embodiment, subsequently performing lapping and wet etching on the sample wafers A1 to A6, and measuring the warping amounts of the sample wafers A1 to A6 after the lapping and after the wet etching. The present inventor also calculated the correction amount for the warping due to the wet etching based on the difference between the measured warping amounts. The warping amount was measured by performing scanning with a stylus-type roughness meter along the two non-forming regions N2 in the X direction along the diameter direction and the Y direction orthogonal to the X direction on the front and back faces of the sample wafers A1 to A6 and making calculations from the difference between the maximum and the minimum of the roughness.

The same lapping conditions were set in the sample wafers A1 to A6. The etching conditions were set such that the same etchant (ammonium fluoride and hydrofluoric acid and pure water) and the same temperature (30° C. to 45° C.) were used in all of the sample wafers but the etching time for the sample wafers A1 to A3 was set to be different from that for the sample wafers A4 to A6. Specifically, the etching time is set to 1 sec (the etching amount is approximately 5 µm on both faces) in the sample wafers A1 to A3, whereas the etching time is set to 5 sec (the etching amount is approximately 10 µm on both faces) in the sample wafers A4 to A6.

Figure 8:
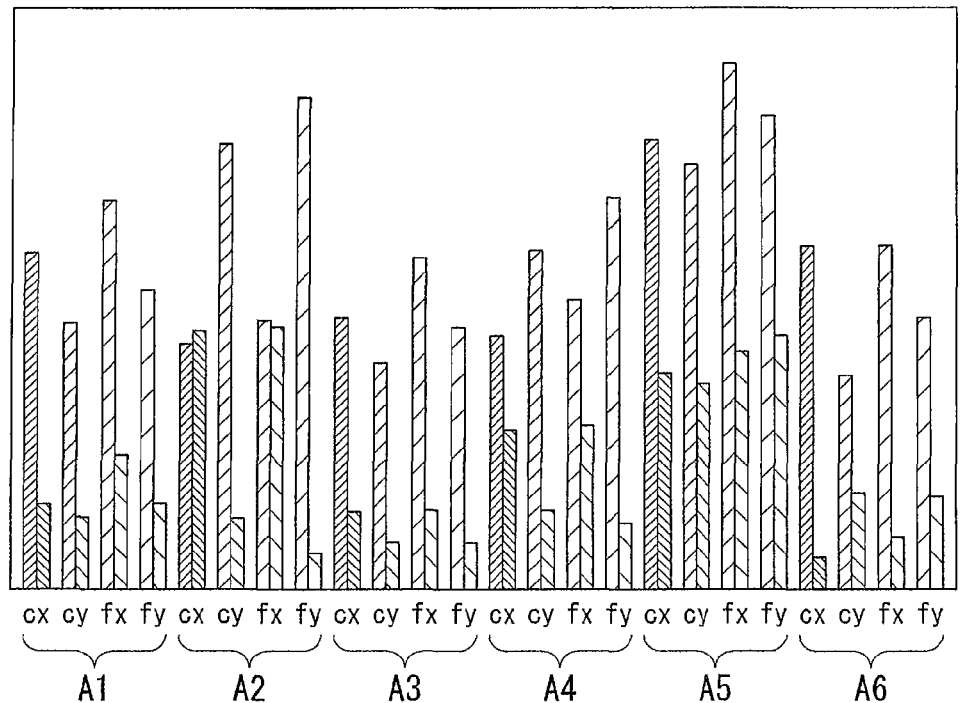
FIG. 8 is a graph representing warping amounts of sample wafers after lapping and after etching.
Figure 9:
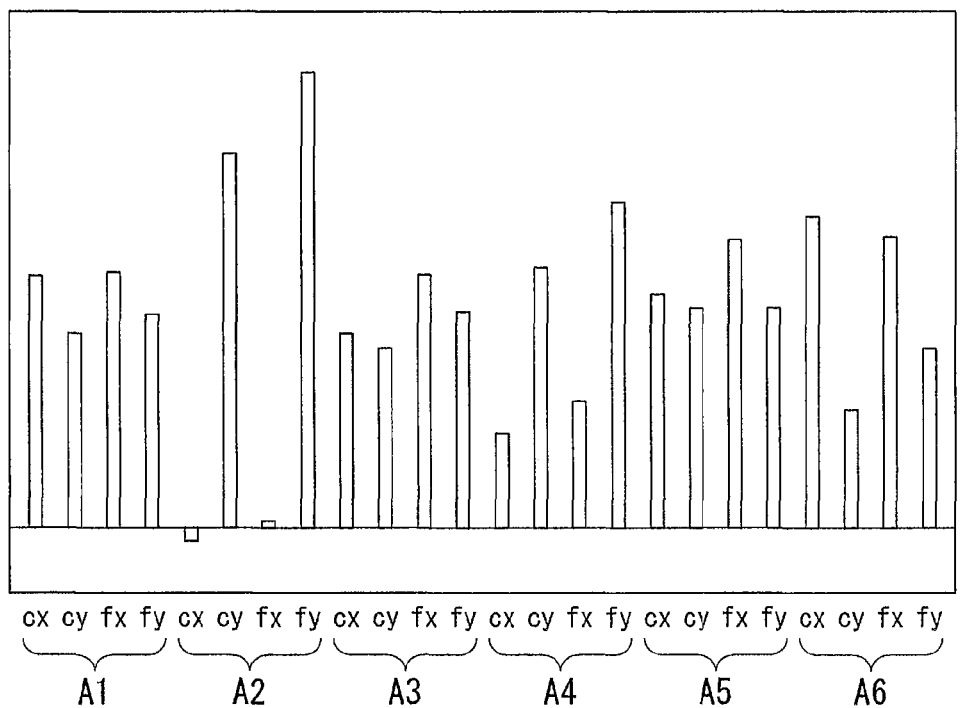
FIG. 9 is a graph showing correction amounts of warping.

FIG. 8 is a graph representing the warping amounts of the sample wafers after the lapping and after the etching. FIG. 9 is a graph showing the correction amount of the warping. In FIGS. 8 and 9, cx represents the X direction in the face having the recess portions 3a formed therein, cy represents the Y direction, fx represents the X direction in the face having no recess portions 3a formed therein, and fy represents the Y direction. In cx to fy of FIG. 8, the left bar represents the warping amount (µm) after the lapping, and the right bar represents the warping amount (µm) after the etching.

As shown in FIGS. 8 and 9, it can be seen that the wet etching performed after the lapping step (S23) could correct the warping over the entire face in almost all of the sample wafers A1 to A6. It is presumed that this was because the wet etching could remove the processing distortion of the sample wafers A1 to A6 produced to the lapping step (S23) as described above. Especially, it can be seen that as the etching time was longer, the correcting amount obtained from the wet etching can be improved more.

Although not shown in the graphs, no improvement of warping was found after the lapping and after the wet etching in a conventional wafer in which the non-forming region was not set. Even when the non-forming region was formed, warping was hardly improved when the wet etching was performed after the lapping and polish were performed.

The technological scope of the invention is not limited to the embodiment described above, and various changes can be made without departing from the spirit or scope of the invention.

For example, while the method of manufacturing the package according to the invention is used and the piezoelectric oscillator is manufactured by putting the piezoelectric oscillating strip within the package in the embodiment described above, a device other than the piezoelectric oscillator may be manufactured by putting an electronic part other than the piezoelectric oscillating strip within the package.

While the method of manufacturing the package according to the invention has been described in the embodiment described above with the example of the piezoelectric oscillator using the tuning fork-type oscillating strip, the invention is not limited thereto. The invention may be applied to a piezoelectric oscillator using an AT cut-type piezoelectric oscillating strip (thickness-shear oscillating strip).

While the above embodiment has been described with the case in which the two non-forming regions N2 are formed in the cross shape, the number of the non-forming regions N2 may be one or a plurality such as three or more.

What is claimed is:

1. A method for producing piezoelectric vibrators, the method comprising:
   (a) defining at least two groups of first substrates in a first face of a first wafer, the first face opposite to a second face of the first wafer, wherein the first substrates are adjacent one another in a respective at least two groups, and the at least two groups are separated from each other by a blank region in which no substrate is defined, such that a surface area of the first face is sufficiently similar to a surface area of the second face to suppress warping of the first wafer;
   (b) defining second substrates on a second wafer similarly to the first substrates defined on the first wafer;
   (c) forming a recess in a respective at least some of the first substrates defined on the first wafer;
   (d) bonding the first and second wafers such that at least some of the first substrates substantially coincide, respectively, with at least some of the corresponding second substrates, wherein a piezoelectric vibrating strip is inside a respective at least some of the coinciding first and second substrate pairs whose first substrates are formed with the recess;
   (e) cutting off, from the first and second wafers, respective at least some of the coinciding first and second substrate pairs.

2. The method according to claim 1, wherein the blank region comprises at least one strip region running radially across the first wafer.

3. The method according to claim 2, wherein the blank region comprises two strip regions running orthogonally to each other.

4. The method according to claim 2, wherein the first substrates are oriented along a direction of the at least one strip.

5. The method according to claim 1, further comprising wet-etching the first wafer between steps (c) and (d).

* * * * *